(12) United States Patent
Huber et al.

(10) Patent No.: US 7,683,395 B2
(45) Date of Patent: Mar. 23, 2010

(54) LIGHT-EMITTING DIODE ARRANGEMENT AND MOTOR VEHICLE HEADLAMP

(75) Inventors: Rainer Huber, Pentling (DE); Joachim Reill, Zeitlarn (DE); Kurt-Jürgen Lang, Regen (DE); Moritz Engl, Regensburg (DE); Markus Hofmann, Bad Abbach (DE); Mario Wanninger, Harting (DE); Michael Sailer, Pentling (DE); Stefan Grötsch, Lengfeld/Bad Abbach (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 719 days.

(21) Appl. No.: 11/239,723

(22) Filed: Sep. 29, 2005

(65) Prior Publication Data
US 2006/0076572 A1    Apr. 13, 2006

(30) Foreign Application Priority Data
Sep. 29, 2004    (DE)   ................. 10 2004 047 324

(51) Int. Cl.
H01L 33/00    (2006.01)
(52) U.S. Cl. ............................ 257/99; 257/E33.075
(58) Field of Classification Search .................. 257/79, 257/88, 89, 90, 91, 92, 93, 98, 99, 100, E33.055, 257/E33.075; 362/459, 487, 502, 503, 504, 362/505, 506, 507
See application file for complete search history.

(56) References Cited

U.S. PATENT DOCUMENTS

| | | | |
|---|---|---|---|
| 4,733,335 A * | 3/1988 | Serizawa et al. ............ 362/503 |
| 6,066,861 A | 5/2000 | Höhn et al. | |
| 6,441,943 B1 * | 8/2002 | Roberts et al. .............. 359/267 |
| 2003/0085642 A1 | 5/2003 | Pelka et al. | |
| 2004/0056254 A1 | 3/2004 | Bader et al. | |
| 2004/0169451 A1 | 9/2004 | Oishi et al. | |
| 2004/0202007 A1 * | 10/2004 | Yagi et al. .................. 362/545 |
| 2004/0264185 A1 | 12/2004 | Grotsch et al. | |

FOREIGN PATENT DOCUMENTS

| | | |
|---|---|---|
| DE | 100 26 255 A1 | 11/2001 |
| DE | 10205695 A1 | 10/2003 |
| DE | 10213042 A1 * | 10/2003 |

(Continued)

OTHER PUBLICATIONS

I Schnitzer et al., "30% external quantum efficiency from surface textured, thin-film light-emitting diodes", Appl. Phys. Lett., vol. 63, No. 16, pp. 2174-2176, Oct. 18, 1993.

Primary Examiner—Sue Purvis
Assistant Examiner—Kevin Quinto
(74) Attorney, Agent, or Firm—Cohen Pontani Lieberman & Pavane LLP (57) ABSTRACT

A light-emitting diode arrangement having at least one light-emitting diode chip (1), each light-emitting diode chip (1) being assigned at least one optical element (4). In addition, the light-emitting diode arrangement has at least one heat-conducting element (13) which is suitable to carry away the heat generated by the light-emitting diode chip, and at least one cooling apparatus which is suitable to carry heat away from the heat-conducting element. The light-emitting diode arrangement is particularly well suited, for example, to use in motor vehicle headlamps.

12 Claims, 7 Drawing Sheets

FOREIGN PATENT DOCUMENTS

| | | |
|---|---|---|
| DE | 102 50 383 A1 | 5/2004 |
| DE | 103 00 416 A1 | 7/2004 |
| DE | 10 2004 009 998 A1 | 9/2004 |
| DE | 103 19 274 A1 | 12/2004 |
| GB | 2 004 045 A | 3/1979 |
| WO | WO 98/12757 | 3/1998 |
| WO | WO 02/097884 A1 | 12/2002 |
| WO | WO 2004/007241 A2 * | 1/2004 |
| WO | WO 2004/040346 A1 | 5/2004 |

* cited by examiner

FIG 19

LIGHT-EMITTING DIODE ARRANGEMENT AND MOTOR VEHICLE HEADLAMP

RELATED APPLICATION

This patent application claims the priority of German patent application no. 10 2004 047 324.4 filed Sep. 29, 2004, the disclosure content of which is hereby incorporated by reference.

FIELD OF THE INVENTION

The invention relates to a light-emitting diode arrangement and a motor vehicle headlamp having such a light-emitting diode arrangement.

SUMMARY OF THE INVENTION

It is an object of the present invention to provide a light-emitting diode arrangement which is cooled particularly efficiently.

It is another object of the present invention to provide a motor vehicle headlamp having such a light-emitting diode arrangement.

These and other objects are attained in accordance with one aspect of the present invention directed to a light-emitting diode arrangement, comprising at least one light-emitting diode chip, each light-emitting diode chip being assigned at least one optical element, at least one heat-conducting element which is suitable to carry away the heat generated by the light-emitting diode chips, and at least one cooling apparatus which is suitable to pick up the heat carried away by the heat-conducting element.

In at least a first embodiment of the light-emitting diode arrangement, each light-emitting diode chip is assigned at least one optical element. The optical elements can be, for example, light-reflecting, light-refracting or light-diffracting optical units. It is possible, for example, for each light-emitting diode chip to be assigned just one optical element. However, it is also possible for a plurality of light-emitting diode chips to be assigned a common optical element.

The light-emitting diode arrangement can have at least one heat-conducting element which is suitable to carry away the heat generated by the light-emitting diode chip. The transport of heat away from the light-emitting diode chip is in this case preferably carried out substantially by means of thermal conduction. The term "substantially by means of thermal conduction" means that other mechanisms for thermal transport, such as thermal radiation or convection, play at most a subordinate role.

The heat-conducting element can be, for example, a carrier on which the light-emitting diode chips are applied.

Furthermore, the light-emitting diode arrangement can have at least one cooling apparatus which is suitable to pick up the heat from the heat-conducting element and to carry it away. The cooling apparatus is in this case preferably suitable to carry away the heat by means of thermal conduction or convection. Furthermore, it is possible for the cooling apparatus to be suitable to carry away the heat generated by the light-emitting diode chips from the heat-conducting element partly by means of thermal conduction and partly by means of convection.

According to another embodiment, a light-emitting diode arrangement can have at least one light-emitting diode chip, each light-emitting diode being assigned at least one optical element. Furthermore, the light-emitting diode arrangement has at least one heat-conducting element which is suitable to carry away the heat generated by the light-emitting diode chips, and at least one cooling apparatus which is suitable to pick up the heat carried away by the heat-conducting element.

In another embodiment of the light-emitting diode arrangement, at least one of the light-emitting diode chips has a radiation output surface through which a large part of the electromagnetic radiation emitted by the light-emitting diode chip is emitted. Particularly preferably, the entire radiation emitted by the light-emitting diode chip emerges through the radiation output surface. The radiation output surface is, for example, provided by part of the surface of the light-emitting diode chip. The radiation output surface is preferably provided by a main surface of the light-emitting diode chip which, for example, is arranged parallel to an epitaxial layer sequence of the light-emitting diode chip which is suitable to generate electromagnetic radiation.

For this purpose, the epitaxial layer sequence can, for example, have a pn junction, a double heterostructure, a single quantum well or, particularly preferably, a multiple quantum well structure (MQW). The designation quantum well structure within the context of the application comprises any structure in which charge carriers experience quantization of their energy states as a result of confinement. In particular, the designation quantum well structure does not contain any statement about the dimensionality of the quantization. It thus comprises, inter alia, quantum wells, quantum wires and quantum points and any combination of these structures.

The light-emitting diode chip is preferably a semiconductor light-emitting diode chip in which the growth substrate has been at least partly removed and a carrier element has been applied to its surface facing away from the original growth substrate.

The carrier element can be chosen relatively freely, as compared with a growth substrate. A carrier element is preferably chosen which, with regard to the thermal expansion coefficient, is particularly well matched to the radiation-generating epitaxial layer sequence. Furthermore, the carrier element can contain a material which is particularly highly heat-conducting. In this way, the heat generated during the operation of the light-emitting diode chip is carried away particularly efficiently to the heat-conducting element.

Such light-emitting diode chips, produced by the removal of the growth substrate, are often designated thin-film light-emitting diode chips and are preferably distinguished by the following features:

(1) On a first main surface of the radiation-generating epitaxial layer sequence, facing toward the carrier element, a reflective layer or layer sequence is applied or formed which reflects at least some of the electromagnetic radiation generated in the epitaxial layer sequence back into the latter.

(2) The epitaxial layer sequence preferably has a thickness of at most 20 µm, particularly preferably of at most 10 µm.

The epitaxial layer sequence preferably contains at least one semiconductor layer having at least one surface which has a mixing structure. In the ideal case, this mixing structure leads to an approximately ergodic distribution of the light in the epitaxial layer sequence, that is to say it has a most ergodic, stochastic scattering behaviour.

A basic principle of a thin-film light-emitting diode chip is, for example, described in the publication by I. Schnitzer et al., Appl. Phys. Lett. 63(16), 18 Oct. 1993, pages 2174 to 2176, of which the disclosure content relating to the basic principle of a thin-film light-emitting diode chip is hereby incorporated by back-reference.

All the light-emitting diode chips of the light-emitting diode arrangement are particularly preferably thin-film light-emitting diode chips.

In another embodiment of the light-emitting diode arrangement, the optical element is suitable to reduce the divergence of the electromagnetic radiation emitted by the light-emitting diode chips.

For this purpose, the optical element can, for example, be a reflective optical unit. This means that the optical element is suitable to reflect at least some of the electromagnetic radiation emitted by the light-emitting diode chips. For this purpose, the optical element can, for example, have side walls which connect a radiation input opening to a radiation output opening of the optical element. The side walls are preferably configured to be reflective. Electromagnetic radiation which enters through the radiation input opening of the optical element can then be at least partly reflected at the side walls and leave the optical element again through the radiation output opening.

For this purpose, the side walls can, for example, be coated with a reflective material. However, the side walls can also contain a dielectric material which has a suitable refractive index, so that radiation entering through the radiation input opening is reflected by total reflection at the interface between side wall and surrounding medium.

The optical element can additionally be a solid body consisting of a dielectric material. The electromagnetic radiation entering the optical element through the radiation input opening is then preferably reflected by means of total reflection at the lateral interfaces of the solid body with the surrounding medium.

The optical element can reduce the divergence of a radiation cone passing through the radiation input opening in at least one spatial direction, in such a way that the radiation cone, as it emerges through the radiation output opening, has an opening angle between 0 and 30°, preferably between 0 and 20°, particularly preferably between 0 and 10°, with respect to a mid-axis of the optical element, which is perpendicular to the radiation output surface of the light-emitting diode chip(s) assigned to the optical element.

In another embodiment of the light-emitting diode arrangement, the reflective optical unit is a non-imaging optical concentrator. In this case, the optical element is preferably arranged downstream of the radiation output surface of at least one light-emitting diode chip such that the radiation input opening of the optical element is the actual radiation outlet opening of the concentrator. In this case, the concentrator tapers toward the light-emitting diode chip. In this way, electromagnetic radiation entering the optical element through the radiation input opening leaves the concentrator through the radiation output opening with reduced divergence. For this purpose, the optical element can at least partly be formed in the manner of one of the following optical elements:

Compound parabolic concentrator (CPC), compound elliptic concentrator (CEC), compound hyperbolic concentrator (CHC). This means that, for example, the reflective side walls of the input element are at least partly formed in the form of at least one of the aforementioned optical elements.

According to at least one embodiment of the light-emitting diode arrangement, the non-imaging optical concentrator can have side walls which connect the radiation input opening to the radiation output opening and are formed in such a way that connecting lines running on the side walls between the radiation input opening and the radiation output opening run rectilinearly. The side walls in this case form, for example, the form of a truncated pyramid or truncated cone. This means that the optical concentrator then has the form of a truncated pyramid or truncated cone which tapers towards the light-emitting diode chip or the light-emitting diode chips to which it is assigned. The concentrator in this embodiment is preferably a solid body which consists of a plastic transparent to radiation.

In another embodiment of the light-emitting diode arrangement, each light-emitting diode chip is assigned just one optical element. The radiation input opening of the optical element is in this case preferably arranged downstream of the radiation output surface of the light-emitting diode chip in the main emission direction of the light-emitting diode chip.

However, it is also possible for a plurality of light-emitting diode chips to be assigned a common optical element. For this purpose, the light-emitting diode chips can for example be arranged along at least one straight line. The radiation input opening of the optical element is then arranged downstream of the total area of the radiation output surface of the individual light-emitting chips in a main emission direction of the light-emitting diode chips.

According to another embodiment, the radiation input opening of the optical element has an area which is at most twice as large as the total radiation output surface of the light-emitting diode chips assigned to the optical element. The total radiation output surface is in this case given by the sum of the areas of the radiation output surfaces of the individual light-emitting diode chips and assigned to the optical element. The area of the radiation input opening is preferably at most 1.5, particularly preferably at most 1.25, times as large as the total radiation output area of the light-emitting diode chips assigned to the optical element.

Such a small radiation input opening permits the spatial angle in which the electromagnetic radiation is emitted to be reduced in size as close as possible to the radiation output surface of the light-emitting diode chip. There, the cross-sectional area of the radiation cone emitted by the light-emitting diode chip is particularly small. This permits the design of components having an optimum etendue. This means that the highest possible radiation intensity is projected onto the smallest possible surface. Here, the etendue is a conservation variable of geometrical optics. It is formed substantially by the product of the area content of the light source and the spatial angle in which the light source emits its radiation.

In at least one embodiment of the light-emitting diode arrangement, a gap, for example an air gap, is arranged between the radiation output surface of the light-emitting diode chip and the radiation input opening of the optical element. As a result, particularly divergent radiation does not get into the optical element but can emerge, for example laterally, through the gap before entering the optical element. Therefore, the divergence of the radiation emitted from the optical element can be reduced further.

Instead of a gap, it is additionally possible, for example, for side walls which are arranged downstream of the radiation output surface of the light-emitting diode chip close to the radiation input opening of the optical element to be designed to be absorbent or transparent to electromagnetic radiation. In this way, it is also possible for the highly divergent proportion of the radiation emitted by the light-emitting diode chip not to enter the optical element.

According to another embodiment of the light-emitting diode arrangement, an additional optical element is arranged in the main emission direction downstream of the radiation output surface of the optical element. The additional optical element is preferably a light-refracting or light-diffracting optical unit with which a further reduction in the divergence of the radiation passing through the additional optical element can be achieved.

In another embodiment of the light-emitting diode arrangement, the light-emitting diode arrangement has a luminescence conversion material which is arranged downstream of the radiation output surface of at least one of the light-emitting diode chips. A luminescence conversion material is preferably arranged downstream of the radiation output surface of each light-emitting diode chip of the light-emitting diode arrangement.

The luminescence convection material is preferably suitable for converting at least some of the wavelengths of the electromagnetic radiation emitted by the light-emitting diode chip. It preferably mixes the radiation emitted by the light-emitting diode chip with its wavelength-converted proportion, for example to form white light.

However, it is also possible for the radiation emitted by the light-emitting diode chip to be wavelength-converted substantially completely by the luminescence conversion material. For example, in this way, radiation emitted by the light-emitting diode chip in the non-visible spectral range can be converted to radiation in the visible spectral range. By using, for example, two different luminescent materials in the luminescence conversion material, for example white light can then be produced by mixing light.

Suitable luminescent materials for wavelength conversion are described in U.S. Pat. No. 6,066,861, the disclosure content of which relating to the luminescent materials is hereby incorporated by reference.

The luminescence conversion material in at least one embodiment of the light-emitting diode arrangement can be admixed with a radiation-transmitting potting compound, for example, which at least partly surrounds the light-emitting diode chip. In this case, the potting compound can contain epoxy or silicone materials, for example.

However, the luminescence conversion material can, for example, also be applied directly as a thin layer to the radiation output surface of the individual light-emitting diode chips.

In addition, it is possible for the luminescence conversion material to be contained at least at some points in the optical element. For example, the luminescence conversion material can be applied as a thin layer to the side walls which are arranged downstream of the radiation output surface of the light-emitting diode chip. The luminescence conversion material can be distributed homogeneously on the side walls.

However, it is advantageously also possible for the luminescence conversion material to be applied to defined points on the side walls. In this way, particularly defined conversion of the electromagnetic radiation passing through the optical element is possible.

According to another embodiment of the light-emitting diode arrangement, a cooling element is applied to the heat-conducting element of the light-emitting diode arrangement. The cooling element preferably consists of a particularly highly heat-conducting material. Particularly preferably, at least one surface of the cooling element is enlarged by means of cooling ribs (radiator). The cooling ribs are located, for example, on the surface of the cooling element facing away from the heat-conducting element.

In another embodiment of the light-emitting diode arrangement, the light-emitting diode arrangement has a cooling apparatus which is suitable to carry heat generated by the light-emitting diode chip away from the heat-conducting element and/or the cooling element. The cooling apparatus is preferably suitable to carry away heat by means of at least one of the following heat transport mechanisms: free convection, forced convection, thermal conduction.

The cooling apparatus preferably contains at least one of the following elements: cooling element, heat-conducting material, heat pipe, thermosyphon, liquid circuit, fan.

The cooling apparatus is suitable, for example, for discharging the heat generated by the light-emitting diode chip to a cooling element which acts like a heat sink. The heat sink can be provided, for example, by the car body of a motor vehicle or by the glasses of a motor vehicle headlamp. However, it can also be provided by a housing of the light-emitting diode arrangement.

According to another embodiment of the light-emitting diode arrangement, the cooling apparatus is suitable to transport the heat generated by the light-emitting diode chip to a location at which it is used for specific heating. Particularly preferably, the heat is transported to this location by means of free convection, forced convection and/or heat conduction. The heat given up by the light-emitting diode chips can in this case be used, for example, for de-icing or defrosting. In the case in which the light-emitting diode arrangement is used in a motor vehicle headlamp, for example, the glasses of the headlamp can be heated up by means of the heat given up by the light-emitting diode chips. It is therefore possible, for example, to free front headlamps as quickly as possible from ice or snow. In addition, when the light-emitting diode arrangement is used as a spotlight outside, it is possible in this way to ensure that the covering glasses of the spotlights remain free of ice or snow. In addition, by means of the specific heating of covering glasses by means of the heat given up by the light-emitting diode chips, the formation of condensation on the covering glasses can at least largely be prevented.

DETAILED DESCRIPTION OF THE DRAWINGS

In the exemplary embodiments and figures, identical or identically acting constituent parts are in each case provided with the same reference symbols. The elements illustrated are not to be viewed as to scale; instead individual elements can illustrated exaggeratedly large for better understanding.

Figure 1:
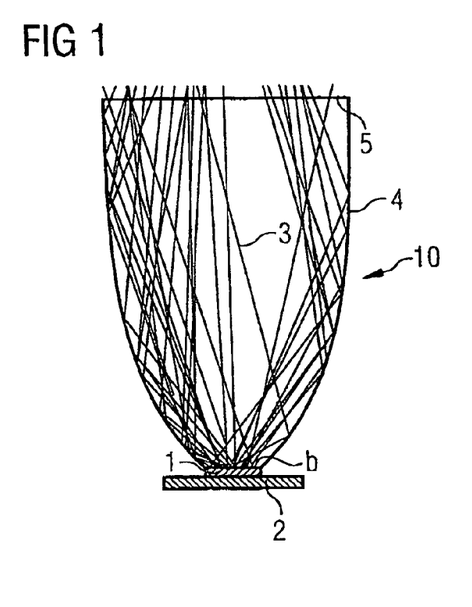
FIG. 1 shows a schematic sectional illustration of an optical element with light-emitting diode chip according to an exemplary embodiment of the light-emitting diode arrangement.

FIG. 1 shows a schematic sectional illustration of an optical element 4 with a light-emitting diode chip 1 according to an exemplary embodiment of the light-emitting diode arrangement.

The light-emitting diode chip 1 is here applied to a carrier 2. The carrier 2 can be mounted, for example, on a second carrier 12 or a first heat-conducting element 13 (see, for example, FIG. 4).

The light-emitting diode chip 1 is, for example, a thin-film light-emitting diode chip, as explained above.

Arranged downstream of the light-emitting diode chip 1 is an optical element 4 which can be, for example, a three-dimensional CPC-like non-imaging optical concentrator. The optical element 4 in this case has a light input opening b through which electromagnetic radiation 3 emitted by the light-emitting diode chip can enter. The electromagnetic radiation 3 is at least partly reflected at the side walls of the optical element 4, which are preferably provided with a reflective coating for this purpose. The radiation 3 then leaves the optical element through the radiation output opening 5.

The closer the radiation input opening b of the optical element 4 is brought to the radiation output surface of the light-emitting diode chip 1, the smaller the radiation input opening b can be configured and the higher is the radiation density (etendue) of the electromagnetic radiation 3 emerging through the radiation output opening 5. Optical element 4 and light-emitting diode chip 1 together form the lighting device 10.

As an alternative to the exemplary embodiment shown in FIG. 1, it is also possible for a plurality of light-emitting diode chips to be arranged, for example along a straight line on the carrier 2, and for these light-emitting diode chips to be assigned a common optical element 4.

Figure 2:
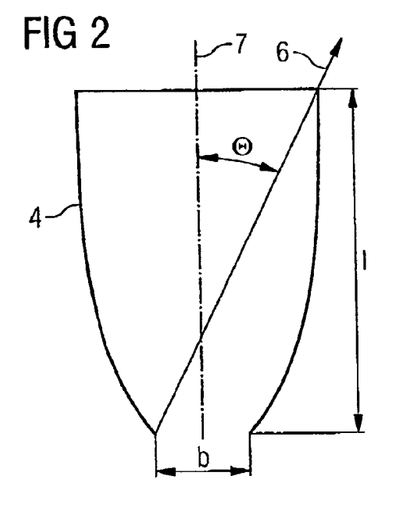
FIG. 2 shows a schematic sketch to explain the functioning of a non-imaging optical concentrator.

FIG. 2 shows that the radiation cone 6 of the radiation passing through the optical element 4 leaves the radiation output opening 5 at a maximum angle θ to the mid-axis 7 of the optical element 4. With a given width of the radiation input opening b, the length l of the optical element 4 in this case determines the angle θ. For an ideal compound parabolic concentrator, the following relationship holds true:

$$l = \frac{b}{2}(1 + \sin\theta)\frac{\cos\theta}{\sin^2\theta}.$$

In order to achieve a maximum opening angle of, for example, θ=9°, the length l of the optical element must be approximately 23 times as great as the width of the radiation input opening b.

Figure 3:
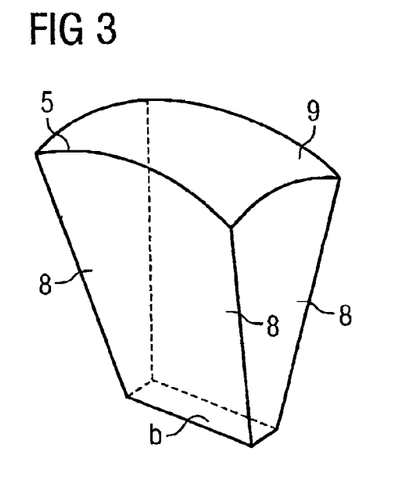
FIG. 3 shows a schematic sectional illustration of an optical element according to an exemplary embodiment of the light-emitting diode arrangement.

FIG. 3 shows that, as an alternative to a CPC-like optical concentrator, the optical element can, for example, have side walls 8 which run in straight lines from the radiation input opening b to the radiation output opening 5. In this case, the optical element can be a solid body made of a dielectric material which has a basic shape like a truncated cone or truncated pyramid. In addition, the radiation output opening 5 can curve outward in the manner of a spherical or aspherical lens, which forms a second optical element 9 which is suitable to reduce further the divergence of the radiation 3 passing through the optical element 4.

Figure 4:
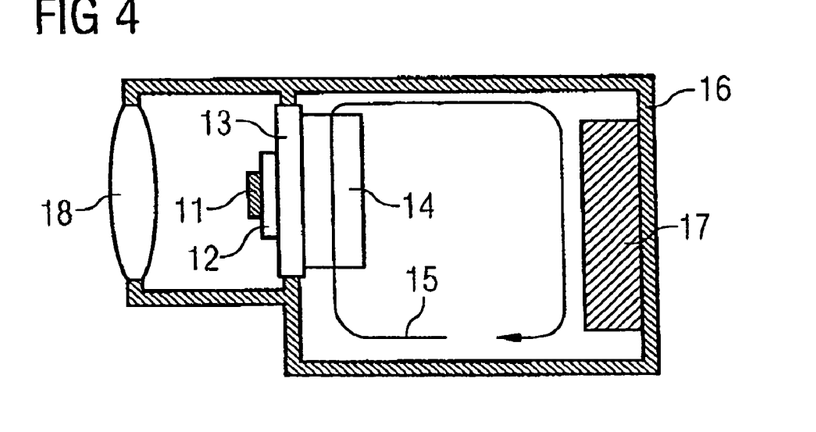
FIG. 4 shows a schematic sectional illustration of a first exemplary embodiment of the light-emitting diode arrangement described here.

FIG. 4 shows a first exemplary embodiment of a light-emitting diode arrangement described here. At least one lighting device 10, as explained for example in FIG. 1, is applied to a carrier 12 here and forms the light source 11. A plurality of lighting devices 10 are preferably applied to a common carrier 12. The lighting devices 10 are, for example, arranged on the carrier 12 in such a way that the electromagnetic radiation emitted by the light source 11 for example meets the German Standard ECE for motor vehicle headlamps. In addition, a further optical element 18 can be arranged downstream of the light source 11. The second optical element 18 is, for example, an optical unit similar to a lens or reflector. For example, the further optical element 18 is a projection lens which, in particular, can also be arranged downstream of a plurality of lighting devices 10.

The carrier 12 is applied with its surface facing away from the light source 11 to a first heat-conducting element 13 which, for example, can be integrated into a housing 16 of the light-emitting diode arrangement. Alternatively, the light source 11 can be applied directly to the heat-conducting element 13; the carrier 12 can then be omitted.

The heat-conducting element 13 preferably consists of a highly heat-conducting material such as copper, aluminium or magnesium.

For the case in which the light-emitting diode arrangement is used in a motor vehicle, the housing 16 of the light-emitting diode arrangement can be formed, for example, by part of the motor vehicle body.

In this exemplary embodiment, a cooling element 14 is applied to the surface of the heat-conducting element 13 facing away from the light source 11. The cooling element 14 preferably contains a particularly highly heat-conducting material such as aluminum or copper. The connection between heat-conducting element 13 and cooling element 14 preferably has a particularly low thermal resistance and is provided, for example, by a soldered connection. The cooling element 14 preferably has cooling ribs, at least on its surface facing away from the heat-conducting element 13. In the exemplary embodiment shown in FIG. 4, the heat from the cooling element 14 is dissipated by means of free convection to a second cooling element 17 which, for example, is connected to the housing 16 of the light-emitting diode arrangement and functions as a heat sink. In this case, the heat is transferred by means of an air stream 15 which is due to the temperature gradient between the first cooling element 14 and second cooling element 17.

Figure 5:
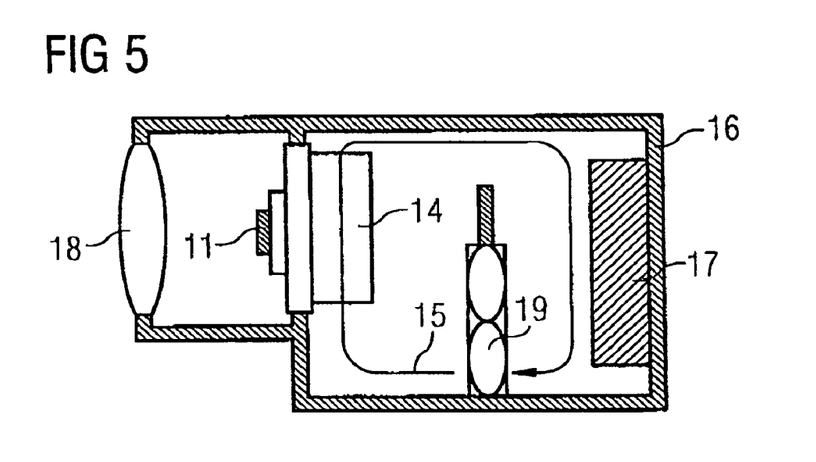
FIG. 5 shows a schematic sectional illustration of a second exemplary embodiment of the light-emitting diode arrangement described here.

As shown in FIG. 5, it is possible for the air circulation in the housing 16 of the light-emitting diode arrangement to be assisted additionally by at least one fan 19.

Figure 6:
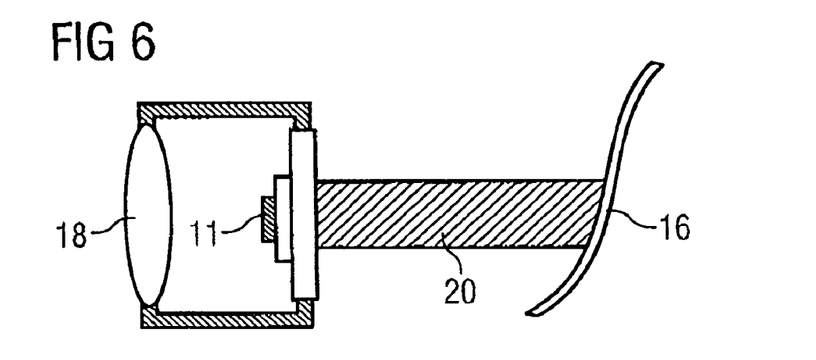
FIG. 6 shows a schematic sectional illustration of a third exemplary embodiment of the light-emitting diode arrangement described here.

FIG. 6 shows an exemplary embodiment of a light-emitting diode arrangement in which the heat generated by the light source 11 is carried away from the first heat-conducting element 13 to the housing 16 by a second heat-conducting element 20. The second heat-conducting element 20 can in this case be, for example, a ribbon cable which contains a heat-conducting material.

Figure 7:
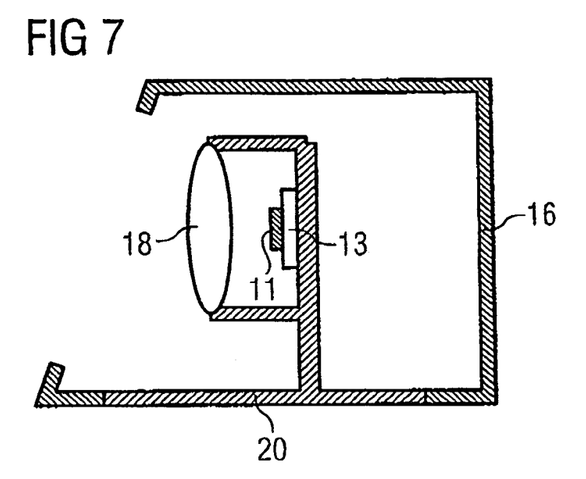
FIG. 7 shows a schematic sectional illustration of a fourth exemplary embodiment of the light-emitting diode arrangement described here.

In the exemplary embodiment of FIG. 7, the first heat-conducting element 13 is formed by a metallic carrier which, for example, can contain aluminum, copper or magnesium. The carrier is, for example, thermally conductively connected to a second heat-conducting element 20, or the first heat-conducting element 13 and second heat-conducting element 20 are designed in one piece. In addition, it is possible for the carrier and therefore the heat-conducting element 13 to function as a holder for the additional optical unit 18 arranged downstream of the light source 11.

Figure 8:
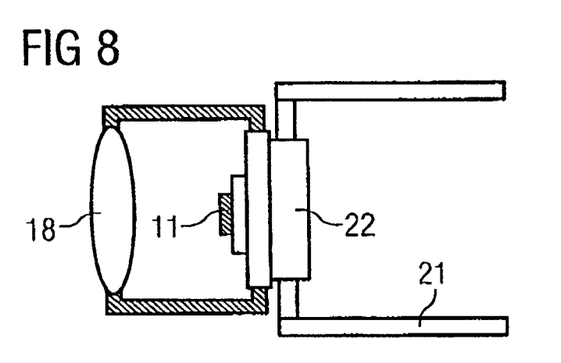
FIG. 8 shows a schematic sectional illustration of a fifth exemplary embodiment of the light-emitting diode arrangement described here.

In the exemplary embodiment of FIG. 8, a liquid cooler 22 is applied to the surface of the heat-conducting element 13 facing away from the light source 11. A cooling circuit 21 carries the heat away from the liquid cooler 22, for example to the housing 16 of the light-emitting diode arrangement.

Figure 9:
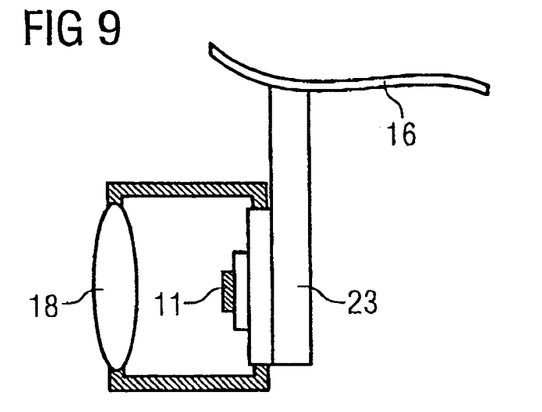
FIG. 9 shows a schematic sectional illustration of a sixth exemplary embodiment of the light-emitting diode arrangement described here.

FIG. 9 shows the cooling of the light-emitting diode arrangement by means of a thermosyphon 23 making thermal contact with the heat-conducting element 13. The thermosyphon 23 dissipates the heat to a cooling element which is placed above the heat-conducting element 13 and, for example, is provided by the housing 16 of the light-emitting diode arrangement or the car body.

Figure 10:
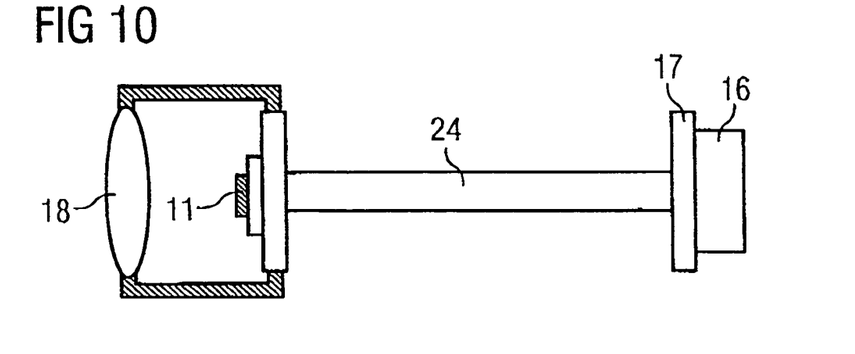
FIG. 10 shows a schematic sectional illustration of a seventh exemplary embodiment of the light-emitting diode arrangement described here.

FIG. 10 shows an exemplary embodiment of the light-emitting diode arrangement in which the heat is dissipated by the heat-conducting element 13 by means of a heat pipe 24. The heat pipe 24 conducts the heat picked up, for example to the housing 16 and/or a cooling element 17. As compared with a thermosyphon, the heat pipe 24 has the advantage that the heat can be carried away in any desired direction. In a manner differing from the thermosyphon, the transport of the cooling liquid in the heat pipe 24 does not take place on account of gravitational forces; instead the cooling liquid is led to the point to be cooled, for example by means of capillary forces on the inner walls of the heat pipe 24.

Figure 11:
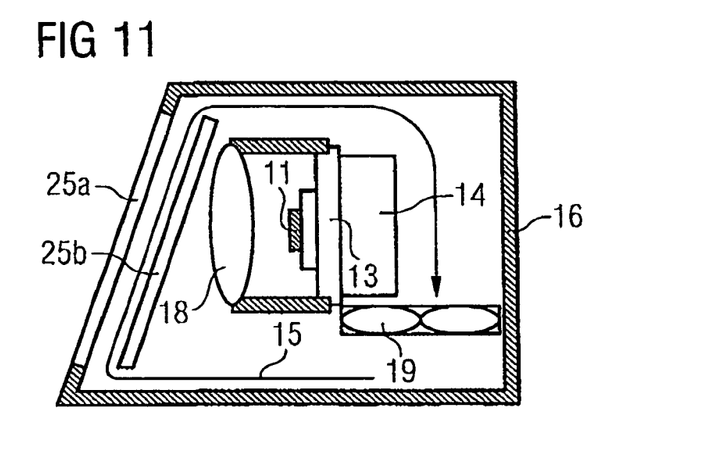
FIG. 11 shows a schematic sectional illustration of an eighth exemplary embodiment of the light-emitting diode arrangement described here.

FIG. 11 shows an exemplary embodiment of the light-emitting diode arrangement in which the heat generated by the light source 11 is transported to a location at which it is used for specific heating. In the exemplary embodiment shown, by means of the cooling apparatus formed by a cooling element 14 and a fan 19, heat is led from the heat-conducting element 13 to outer and inner covering glasses 25a, 25b. In this case, the covering glasses 25a, 25b are, for example, covering glasses of a motor vehicle headlamp. An air stream 15 is guided through between the covering glasses 25a, 25b, for example by means of the fan 19. In this case, for example, the air stream 15 de-ices the covering glasses 25a, 25b in that the heat from the air stream 15 is dissipated to the covering glasses 25a, 25b. The air stream 15 cooled down in this way is then led past the cooling element 14 again, where it can pick up the heat generated by the light-emitting diode chips.

Figure 12:
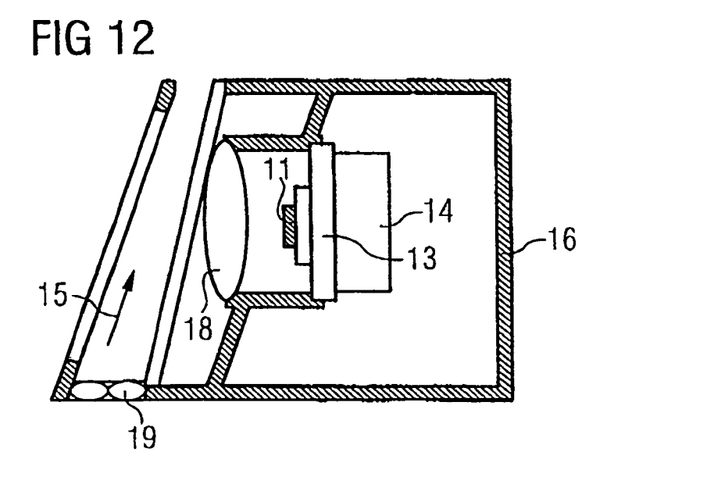
FIG. 12 shows a schematic sectional illustration of a ninth exemplary embodiment of the light-emitting diode arrangement described here.

Alternatively, as shown in FIG. 12, it is possible for the waste heat from a further heat source, for example from the engine compartment of a motor vehicle, to be led between the two covering glasses 25a, 25b by means of a fan or blower 19. In addition, cooling of the light-emitting diode arrangement can be carried out, for example, by one of the cooling apparatuses described above. It is also possible for the waste heat from a further heat source and the waste heat from the light source 11 to be used for heating the covering glasses 25a, 25b.

Figure 13:
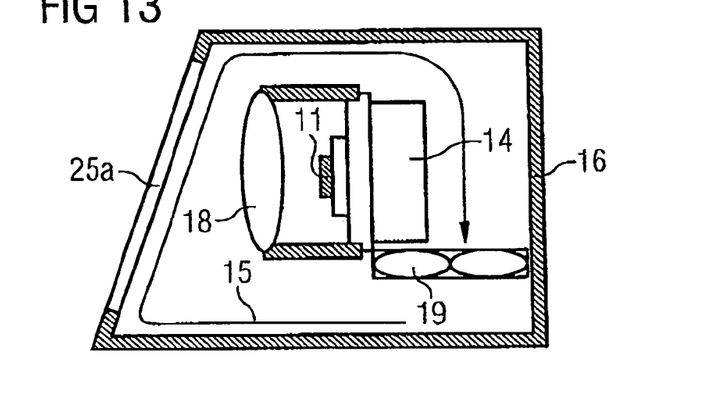
FIG. 13 shows a schematic sectional illustration of a tenth exemplary embodiment of the light-emitting diode arrangement described here.

FIG. 13 shows the heating of a single covering glass 25a in a manner analogous to the exemplary embodiment explained in FIG. 11 by means of forced convection. At least one fan 19 is arranged suitably in the housing 16 of the light-emitting diode arrangement so that an air stream 15 can be led both past the covering glass 25a and past the cooling element 14. In this case, the additional optical element 18 can also be heated.

Figure 14:
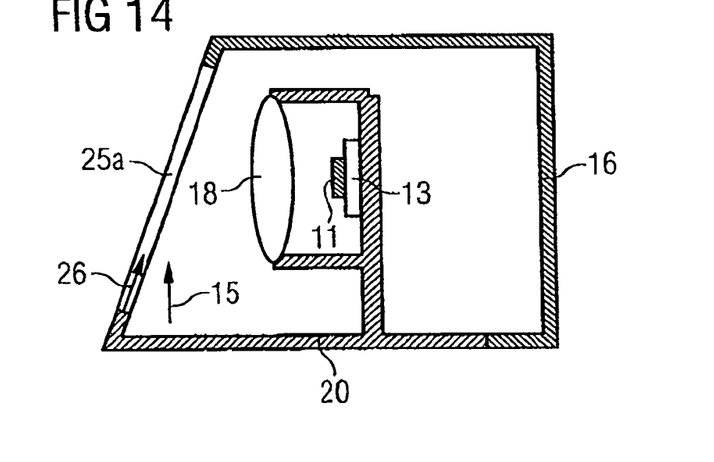
FIG. 14 shows a schematic sectional illustration of an eleventh exemplary embodiment of the light-emitting diode arrangement described here.

FIG. 14 shows an exemplary embodiment of the light-emitting diode arrangement in which the heat-conducting element 13 is formed by a metallic carrier. The carrier can contain at least one of the following materials: aluminum, copper, magnesium. The heat-conducting element 13 is, for example, thermally conductively connected to a second heat-conducting element 20, or the two heat-conducting elements 13, 20 are designed in one piece. The heat-conducting element 13 can additionally serve as a holder for an optical element 18 which is arranged downstream of the light source 11. The heat-conducting element 13, 20 is suitable to carry heat away from the light source 11 to the covering glass 25a. The covering glass 25a can be heated by means of thermal conduction 26 and/or free convection 15. In addition, the exemplary embodiment shown permits specific heating of the optical element 18. In this way, the optical element 18 can, for example, be defrosted by the heat given up by the light source 11.

Figure 15:
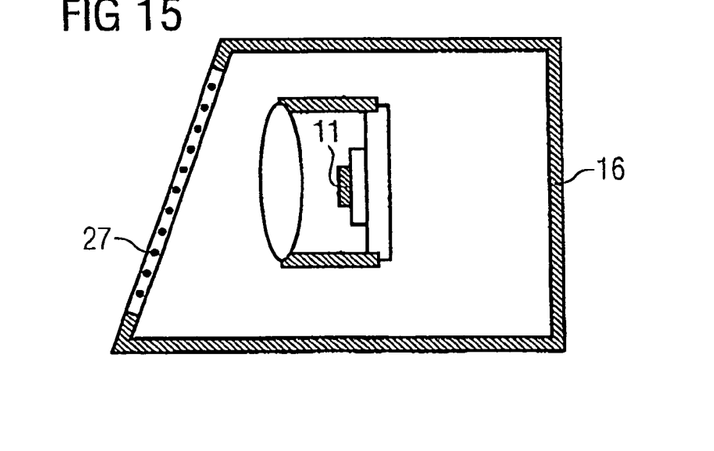
FIG. 15 shows a schematic sectional illustration of a twelfth exemplary embodiment of the light-emitting diode arrangement described here.

FIG. 15 shows the heating of the covering glass 25a by means of a glass heater which, for example, consists of at least one thin metallic wire 27. The wire 27 can be heated, for example, by means of an electric current.

Figure 16:
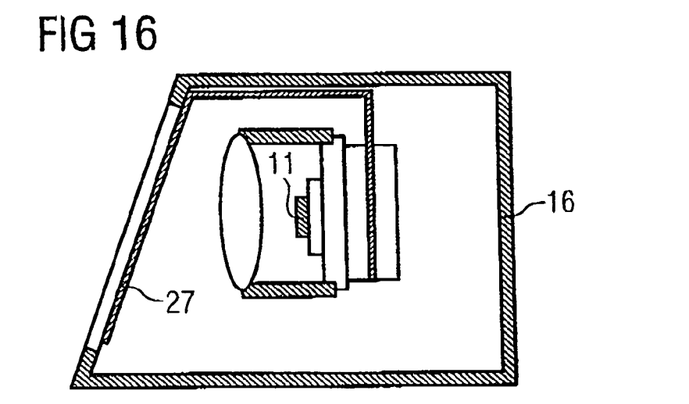
FIG. 16 shows a schematic sectional illustration of a thirteenth exemplary embodiment of the light-emitting diode arrangement described here.

In addition, it is possible for the wire 27 to be connected in a heat-conducting manner to the heat-conducting element 13. As shown in FIG. 16, the heat generated by the light source 11 is then led to the covering glass 25a, for example, by means of the wire 27.

Figure 17:
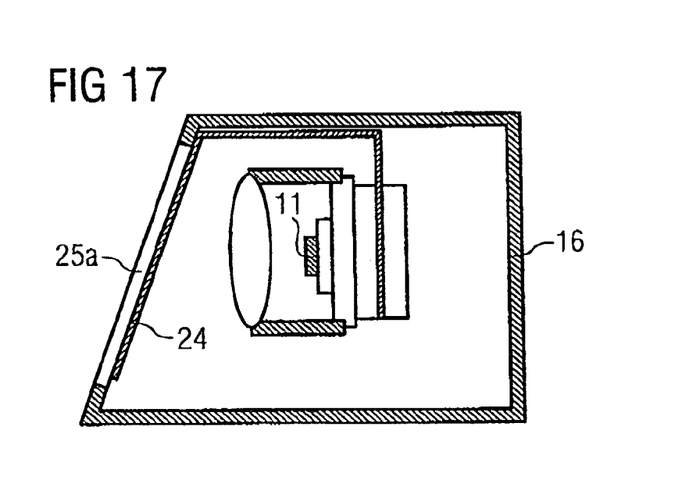
FIG. 17 shows a schematic sectional illustration of a fourteenth exemplary embodiment of the light-emitting diode arrangement described here.

FIG. 17 shows an exemplary embodiment of the light-emitting diode arrangement in which the covering glass 25a is heated by means of a heat pipe 24. In addition, it is also possible for the heat pipe to coduct heat to the optical element 18, for example, as well.

Figure 18:
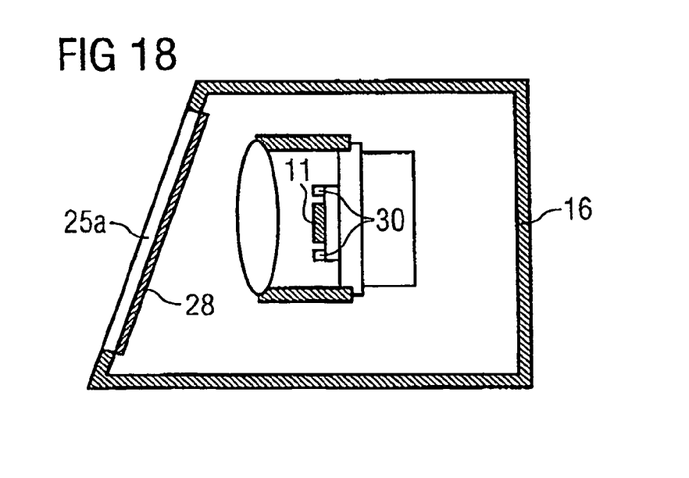
FIG. 18 shows a schematic sectional illustration of a fifteenth exemplary embodiment of the light-emitting diode arrangement described here.

In the exemplary embodiment of FIG. 18, an absorber 28 which is suitable, for example, to convert infrared or UV radiation into heat is applied to the covering glass 25a. In this way, the covering glass 25a can be heated by means of infrared or UV radiation which, for example, is emitted by the light source 11.

Figure 19:
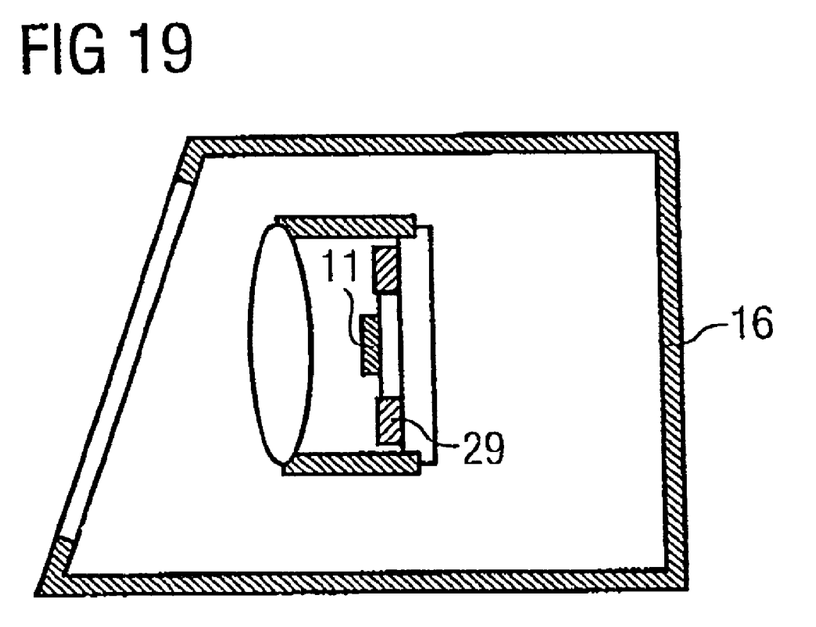
FIG. 19 shows a schematic sectional illustration of a sixteenth exemplary embodiment of the light-emitting diode arrangement described here.

FIG. 19 shows an exemplary embodiment of the light-emitting diode arrangement in which, in addition to the light source 11, at least one heat source or infrared source 29 which emits heat toward the covering glass 25a is applied to the carrier 12. The heat source can be, for example, at least one of the following components: Infrared LED 30 (see FIG. 18), high power laser, incandescent lamp, halogen lamp, gas discharge lamp (29). If the heat source is an infrared LED 30, some of the electromagnetic radiation can also be used for illumination. For example, by using a night vision appliance, poorly illuminated objects and persons can then be made visible.

In all the exemplary embodiments mentioned, it is additionally possible for the light source 11 to be mounted in such a way that the main emission direction of the light emitted by the light source faces away from the covering glass 25a, 25b. The light source 11 then radiates, for example, into a further optical element, for example a reflector, which diverts the light from the light source 11 onto the covering glass 25a, 25b.

The above explanation of the invention using the exemplary embodiments is not to be understood as restricting the invention to the exemplary embodiments. For example, the invention is in no way restricted to motor vehicle headlamps but covers all conceivable types of headlamps. Features which have been explained by using different exemplary embodiments can be combined with one another as desired, irrespective of the exemplary embodiment. The invention covers every novel feature and every combination of features which, in particular, contains any combination of features in the claims, even if these features or these combinations themselves are not explicitly specified in the patent claims or in the exemplary embodiments.

We claim:

1. A motor vehicle headlamp with a light-emitting diode arrangement which is provided as a light source of the motor vehicle, comprising:
   at least one light-emitting diode chip, each light-emitting diode chip being assigned at least one optical element;
   at least one heat-conducting element configured to dissipate heat generated by the at least one light-emitting diode chip; and
   at least one cooling apparatus configured to conduct the heat carried away by the heat-conducting element;
   wherein the at least one cooling apparatus conducts the heat generated by the at least one light-emitting diode chip of the light-emitting diode arrangement to one of a covering glass and an optical element of the motor vehicle headlamp for heating said one of the covering glass and the optical element;
   wherein the at least one cooling apparatus comprises at least one of a heat pipe and wire; and
   wherein the at least one cooling apparatus is in direct contact with at least one of the covering glass and the optical element to conduct the generated heat to the at least one of the covering glass and the optical element.

2. The light-emitting diode arrangement according to claim 1, wherein said at least one light-emitting diode chip comprises a thin-film light-emitting diode chip.

3. The light-emitting diode arrangement according to claim 1, wherein the optical element is at least partly formed as at least one of the following optical elements: a compound parabolic concentrator (CPC), a compound elliptic concentrator (CEC) and a compound hyperbolic concentrator (CHC).

4. The light-emitting diode arrangement according to claim 1, wherein the optical element includes a radiation input opening having an area which is at most twice as large as a total radiation output surface of said at least one light-emitting diode chip assigned to the optical element.

5. The light-emitting diode arrangement according to claim 1, further comprising a cooling element applied to the at least one heat-conducting element.

6. The light-emitting diode arrangement according to claim 1, wherein the at least one cooling apparatus is configured to conduct heat by free or forced convection.

7. The light-emitting diode arrangement according to claim 1, wherein the cooling apparatus is configured to transport heat generated by the at least one light-emitting diode chip to a location at which said heat is used for specific heating.

8. The light-emitting diode arrangement according to claim 1, wherein the heat generated by the at least one light-emitting diode chip is used for de-icing.

9. The motor vehicle headlamp according to claim 1, wherein the cooling apparatus conducts the heat generated by the at least one light-emitting diode chip to the covering glass of the motor vehicle headlamp for de-icing the covering glass.

10. The motor vehicle headlamp according to claim 1, wherein the cooling apparatus conducts the heat generated by the at least one light-emitting diode chip to the optical element of the motor vehicle headlamp for de-icing the optical element.

11. The motor vehicle headlamp according to claim 1, further comprising an absorber configured to convert an infrared or UV radiation into heat and applied to the covering glass of the motor vehicle headlamp.

12. The motor vehicle headlamp according to claim 1, further comprising an infrared LED which irradiates the covering glass of the motor vehicle headlamp.

* * * * *